United States Patent
Radosavljevic et al.

(10) Patent No.: US 10,804,359 B2
(45) Date of Patent: Oct. 13, 2020

(54) GEOMETRIC MANIPULATION OF 2DEG REGION IN SOURCE/DRAIN EXTENSION OF GAN TRANSISTOR

(71) Applicant: INTEL CORPORATION, Santa Clara, CA (US)

(72) Inventors: Marko Radosavljevic, Portland, OR (US); Han Wui Then, Portland, OR (US); Sansaptak Dasgupta, Hillsboro, OR (US); Sanaz Gardner, Portland, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 15/772,742

(22) PCT Filed: Dec. 14, 2015

(86) PCT No.: PCT/US2015/065455
§ 371 (c)(1),
(2) Date: May 1, 2018

(87) PCT Pub. No.: WO2017/105384
PCT Pub. Date: Jun. 22, 2017

(65) Prior Publication Data
US 2019/0214464 A1    Jul. 11, 2019

(51) Int. Cl.
*H01L 29/10*     (2006.01)
*H01L 29/66*     (2006.01)
(Continued)

(52) U.S. Cl.
CPC .......... *H01L 29/10* (2013.01); *H01L 29/0657* (2013.01); *H01L 29/2003* (2013.01);
(Continued)

(58) Field of Classification Search
None
See application file for complete search history.

(56) References Cited

U.S. PATENT DOCUMENTS

| | | | |
|---|---|---|---|
| 7,238,560 B2* | 7/2007 | Sheppard | .......... H01L 29/66462 438/172 |
| 7,915,608 B2* | 3/2011 | Hellings | ............ H01L 29/0843 257/194 |

(Continued)

FOREIGN PATENT DOCUMENTS

WO    2017/105384 A1    6/2017

OTHER PUBLICATIONS

International Search Report and Written Opinion received for PCT Application No. PCT/US2015/065455. dated Aug. 19, 2016. 12 pages.

(Continued)

*Primary Examiner* — Andres Munoz
(74) *Attorney, Agent, or Firm* — Finch & Maloney PLLC

(57) ABSTRACT

Techniques are disclosed for producing integrated circuit structures that include one or more geometrically manipulated polarization layers. The disclosed structures can be formed, for instance, using spacer erosion methods in which more than one type of spacer material is deposited on a polarization layer, and the spacer materials and underlying regions of the polarization layer may then be selectively etched in sequence to provide a desired profile shape to the polarization layer. Geometrically manipulated polarization layers as disclosed herein may be formed to be thinner in regions closer to the gate than in other regions, in some embodiments. The disclosed structures may eliminate the need for a field plate and may also be configured with polarization layers that are shorter in lateral length than polarization layers of uniform thickness without sacrificing (Continued)

performance capability. Additionally, the disclosed techniques may provide increased voltage breakdown without sacrificing Ron.

20 Claims, 9 Drawing Sheets

(51) Int. Cl.
*H01L 29/20* (2006.01)
*H01L 29/778* (2006.01)
*H01L 29/06* (2006.01)
H01L 29/08 (2006.01)
H01L 21/308 (2006.01)
H01L 21/306 (2006.01)

(52) U.S. Cl.
CPC .. *H01L 29/66462* (2013.01); *H01L 29/66522* (2013.01); *H01L 29/778* (2013.01); *H01L 29/7786* (2013.01); H01L 21/3086 (2013.01); H01L 21/30612 (2013.01); H01L 29/0847 (2013.01)

(56) References Cited

U.S. PATENT DOCUMENTS

| | | | |
|---|---|---|---|
| 7,989,816 B2* | 8/2011 | Sato | H01L 29/0657 257/192 |
| 8,680,536 B2* | 3/2014 | Khalil | H01L 29/402 257/76 |
| 8,999,780 B1 | 4/2015 | Khalil et al. | |
| 10,192,986 B1* | 1/2019 | Khalil | H01L 29/4236 |
| 2004/0021152 A1* | 2/2004 | Nguyen | H01L 29/7787 257/192 |
| 2005/0023555 A1* | 2/2005 | Yoshida | H01L 29/66462 257/192 |
| 2007/0158692 A1* | 7/2007 | Nakayama | H01L 29/4236 257/213 |
| 2007/0176204 A1* | 8/2007 | Murata | H01L 29/7787 257/192 |
| 2009/0242938 A1 | 10/2009 | Niiyama et al. | |
| 2010/0025730 A1* | 2/2010 | Heikman | H01L 29/7787 257/194 |
| 2011/0057257 A1* | 3/2011 | Park | H01L 29/4236 257/330 |
| 2012/0112202 A1 | 5/2012 | Hwang et al. | |
| 2012/0261720 A1* | 10/2012 | Puglisi | H01L 29/66462 257/194 |
| 2013/0313612 A1* | 11/2013 | Khalil | H01L 29/4236 257/194 |
| 2014/0015011 A1 | 1/2014 | Khan et al. | |

OTHER PUBLICATIONS

International Preliminary Report on Patentability received for PCT Application No. PCT/US2015/065455. dated Jun. 19, 2018. 8 pages.

* cited by examiner

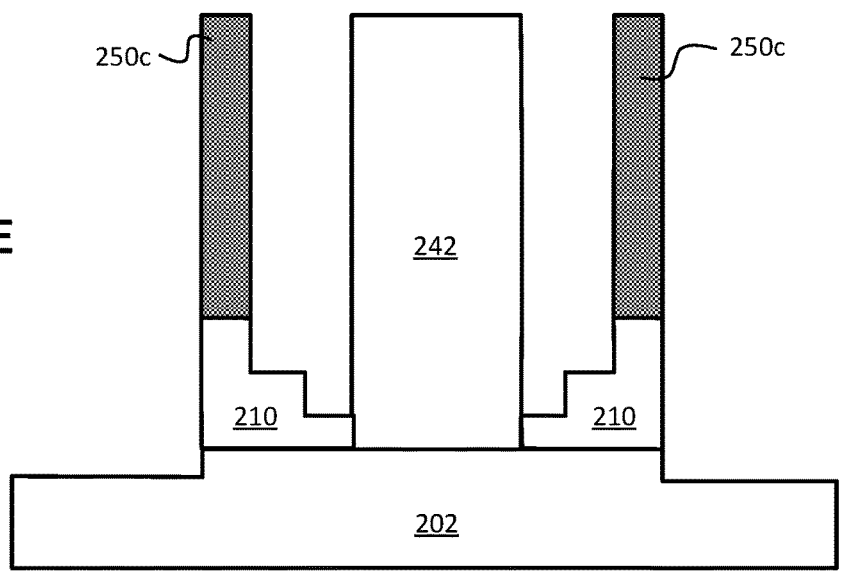
FIG. 2E
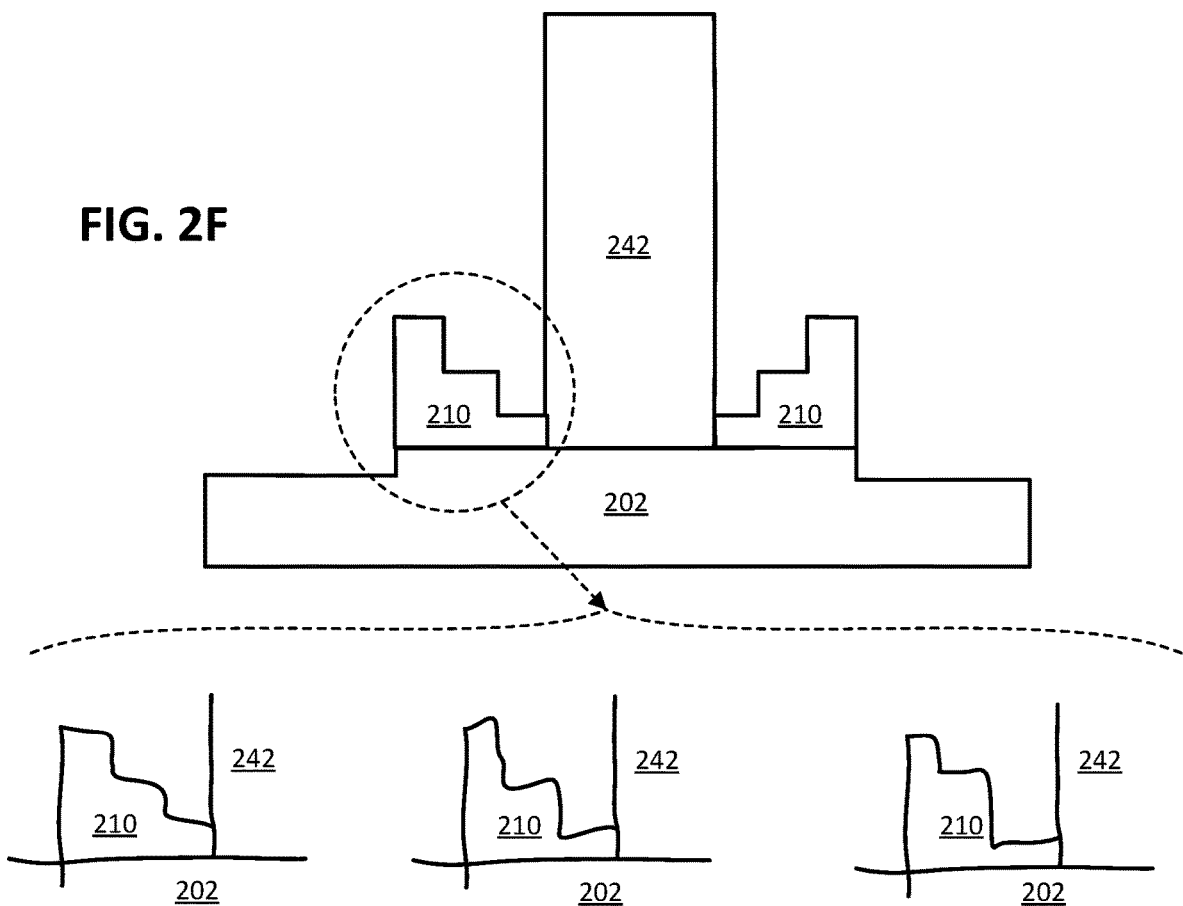
FIG. 2F
FIG. 2F'  FIG. 2F''  FIG. 2F'''

GEOMETRIC MANIPULATION OF 2DEG REGION IN SOURCE/DRAIN EXTENSION OF GAN TRANSISTOR

BACKGROUND

In the manufacture of integrated circuits, a polarization layer may be disposed on the surface of the semiconductor channel. The polarization layer can serve as a charge-inducing layer to controllably supply carriers to the semiconductor channel.

BRIEF DESCRIPTION OF THE DRAWINGS

FIGS. 2A-2F''' illustrate cross-section side views of a series of integrated circuit structures showing formation of a geometrically manipulated polarization layer, in accordance with an example embodiment of the present disclosure.

Figure 1:
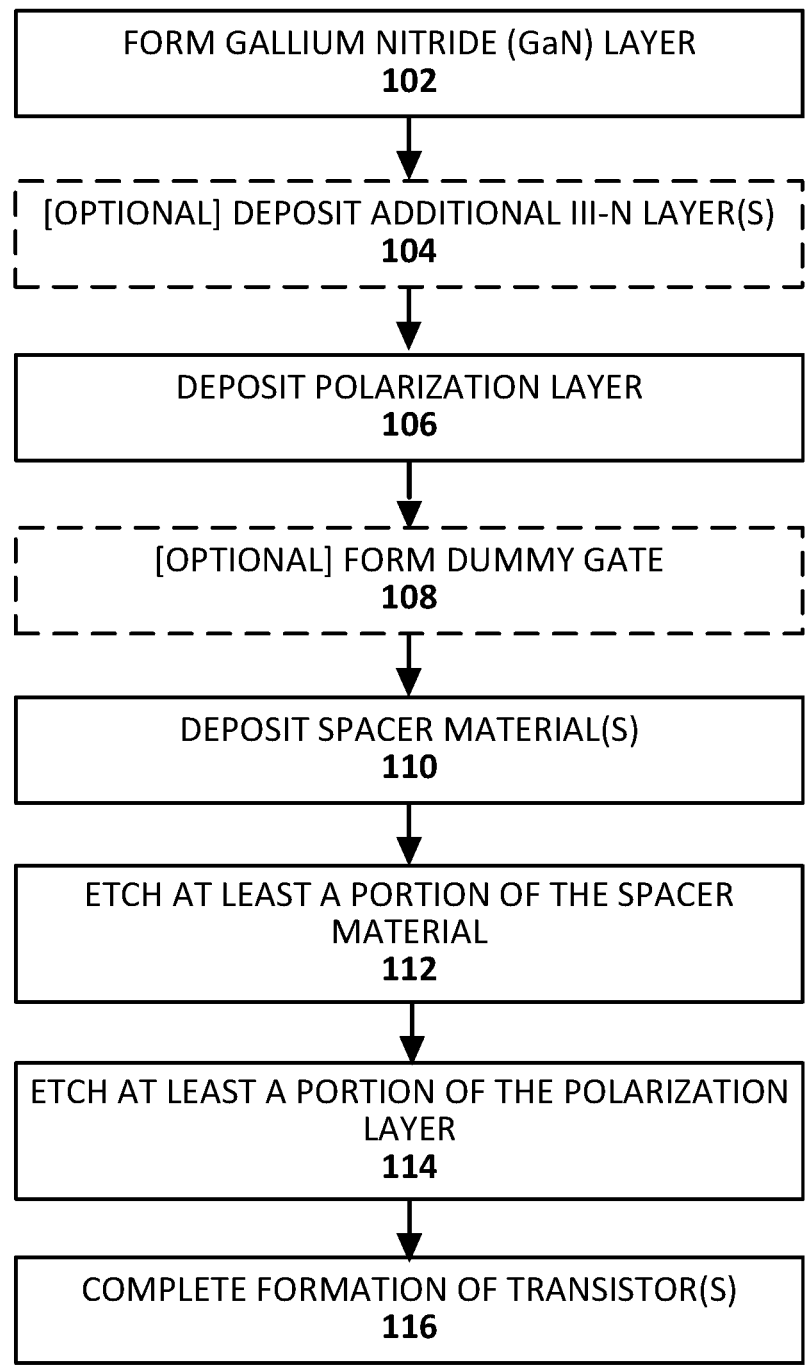
FIG. 1 illustrates an example technique of producing an integrated circuit comprising at least one geometrically manipulated polarization layer, in accordance with embodiments of the present disclosure.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for geometric manipulation of the 2DEG region in the source/drain extension of GaN transistors. Specifically, the described techniques provide for forming integrated circuit structures that include geometrically manipulated polarization layers having non-uniform thicknesses. In some embodiments, the disclosed geometrically manipulated polarization layers may be thinner in regions closer to the gate. For example, in some embodiments the thickness of the polarization layer in a region close to the gate may be at least 50% less than its thickness at another point further from the gate. In some embodiments, the thickness of the polarization layer may vary, for example, by more than 5 nm. Thus, from a structural viewpoint, a geometrically manipulated polarization layer as provided herein may include a cross-sectional profile that reveals thinner regions of the polarization layer proximate to the gate, such as a staircase profile where the stairs descend toward the gate, a slanted profile where the slant descends downward toward the gate, a notch or step profile where the notched or step portion is closer to the gate, or any other geometric shape having a thinner cross-sectional profile proximate to the gate relative to other portions farther from the gate. Geometrically manipulated polarization layers as described herein may provide benefits if located on both sides of the gate or if located on only one side of the gate (e.g., in either the source or drain region). The disclosed geometrically manipulated polarization layers may be able to achieve the same or superior performance capabilities as non-manipulated polarization layers while being shorter in length. In addition to other advantages, the disclosed geometrically manipulated polarization layers may also provide increased voltage breakdown without sacrificing on-state resistance (Ron). Numerous configurations and variations will be apparent in light of this disclosure.

General Overview

Gallium nitride (GaN) technology shows great promise for transistor technology where high voltage breakdown and low on-state resistance (Ron) is needed, such as in power management integrated circuits (PMIC) and radio frequency (RF) power amplification. GaN transistors can outperform silicon (Si) and gallium arsenide (GaAs) technologies that are currently being used in these applications. GaN has a wide bandgap of 3.4 eV (e.g., compared to the 1.4 eV bandgap of GaAs and 1.1 bandgap of Si), therefore allowing GaN transistors to withstand larger electric fields (applied voltage, $V_{DD}$) before suffering breakdown. For example, the electric field that GaN transistors can withstand may be magnitudes larger than that of a GaAs transistor of similar dimensions can withstand before suffering breakdown. Due to its wide bandgap, GaN is particularly suited for RF power amplifiers. Its high mobility and large charge density allow GaN transistors to achieve low Ron, resulting in high RF power-added efficiencies at high RF output power densities. These unique properties offer significant advantages over GaAs and Si RF power amplifiers. As will be appreciated in light of this disclosure, GaN transistors may also be scaled down to even smaller physical dimensions while operating at the same $V_{DD}$, thereby enabling smaller on-resistance, smaller capacitance and smaller transistor widths, resulting in benefits such as reduced power dissipation, higher circuit efficiencies, and smaller form factor. However, in a transistor of any given material, Ron and voltage breakdown are normally exchanged for one another in a tradeoff fashion. For example, if better Ron is needed, it can be achieved at the expense of lower breakdown voltage and vice versa. To this end, techniques for achieving improved Ron/breakdown tradeoff are disclosed herein. Specifically, the disclosed techniques of geometric manipulation of the 2DEG region in the source/drain extension of GaN transistors may provide increased voltage breakdown without sacrificing Ron.

As will be appreciated in light of this disclosure, the disclosed geometrically manipulated 2DEG layers can achieve comparable or improved depletion effects at negative voltage as compared to designs that rely on the use of a field plate. Additionally, if the polarization layer is thinned only in a region near the gate electrode, Ron will suffer minimal or no impact. As will further be appreciated in light of this disclosure, note that the charge density of the 2DEG is proportional to the thickness of the polarization layer. Thus, and in accordance with some embodiments of the present disclosure, by thinning the polarization layer near the gate electrode, the depletion effect that a field plate achieves at negative voltage may be realized without the need to employ a field plate. In other embodiments; however, a field plate may be employed in addition to one or more geometrically manipulated polarization layers, as described herein.

Thus, techniques are provided for forming geometrically manipulated polarization layers. In some embodiments, both the polarization layer on the source side and the drain side are geometrically manipulated, whereas in other embodiments only the polarization layer on the drain side is geometrically manipulated. Various techniques are described to achieve geometric manipulation of the polarization layer, including spacer erosion and dual spacer techniques, although many other techniques will become apparent in light of this disclosure. The disclosed techniques of geometrically manipulating the one or more polarization layers may provide various advantages over known methods of attempting to improve the Ron/break down tradeoff. Additionally, the disclosed polarization layers may have a shorter length than polarization layers of uniform thickness while maintaining the same or better performance capability, thereby facilitating scaling. Numerous variations and configurations will be apparent in light of this disclosure.

Architecture and Methodology

Figure 2A:
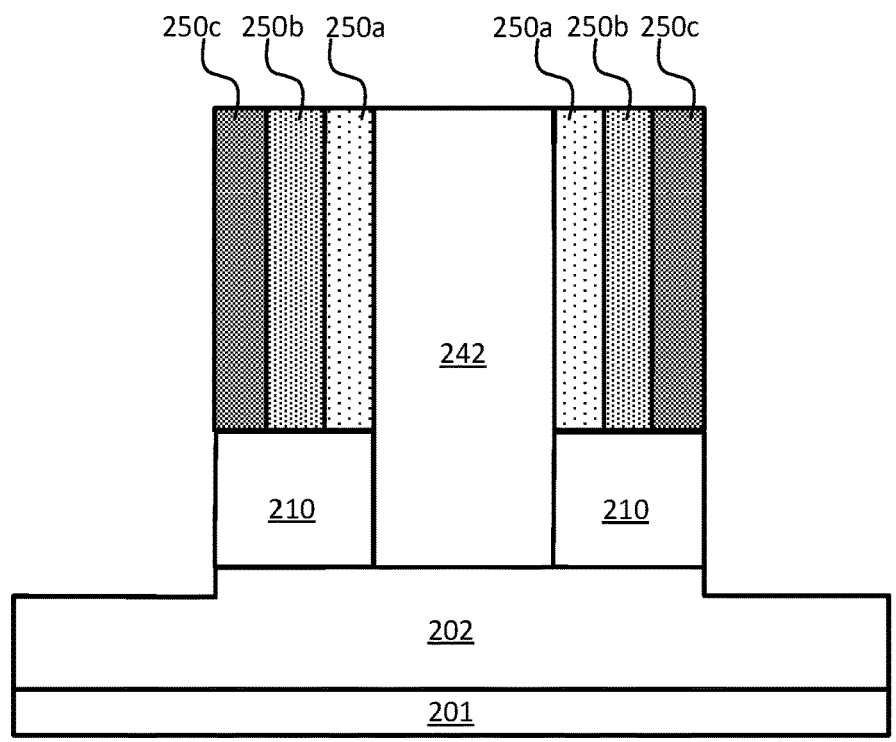
Figure 2B:
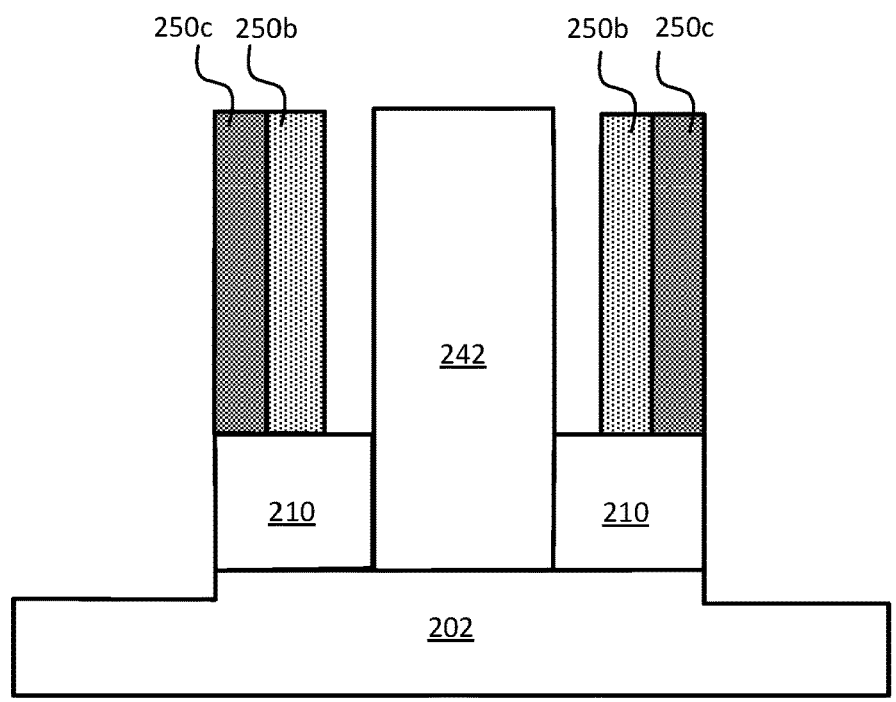
Figure 2C:
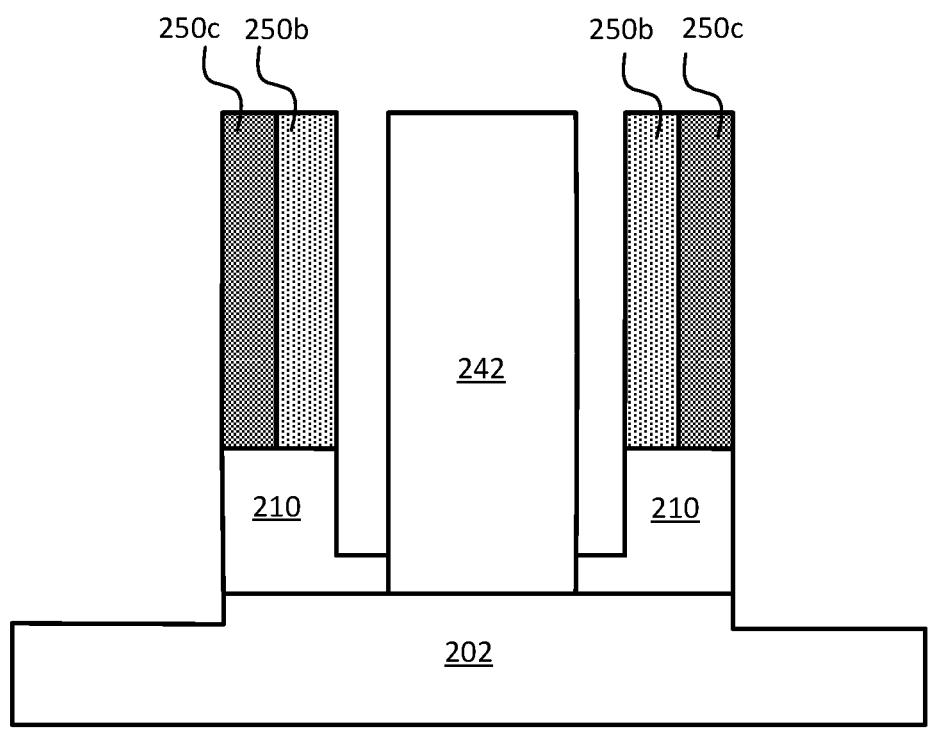
Figure 2D:
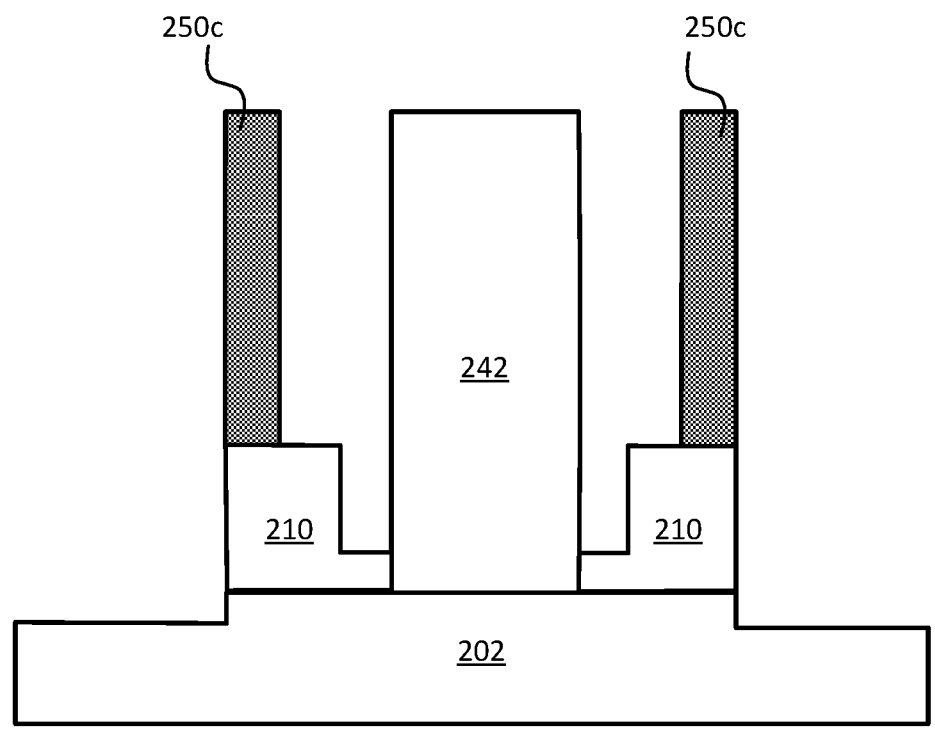
Figure 3A:
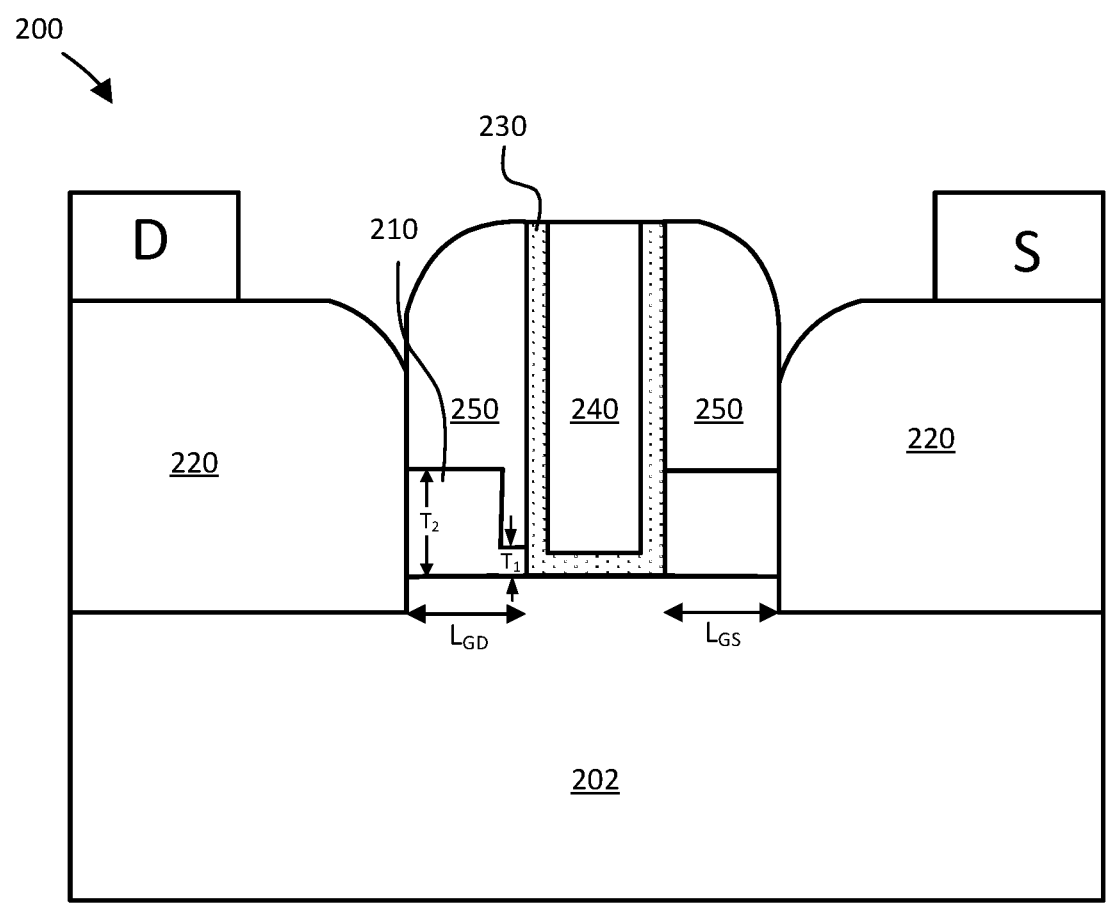
FIGS. 3A-3C illustrate example integrated circuit structures having at least one geometrically manipulated polarization layer, in accordance with various embodiments of the present disclosure.
Figure 3B:
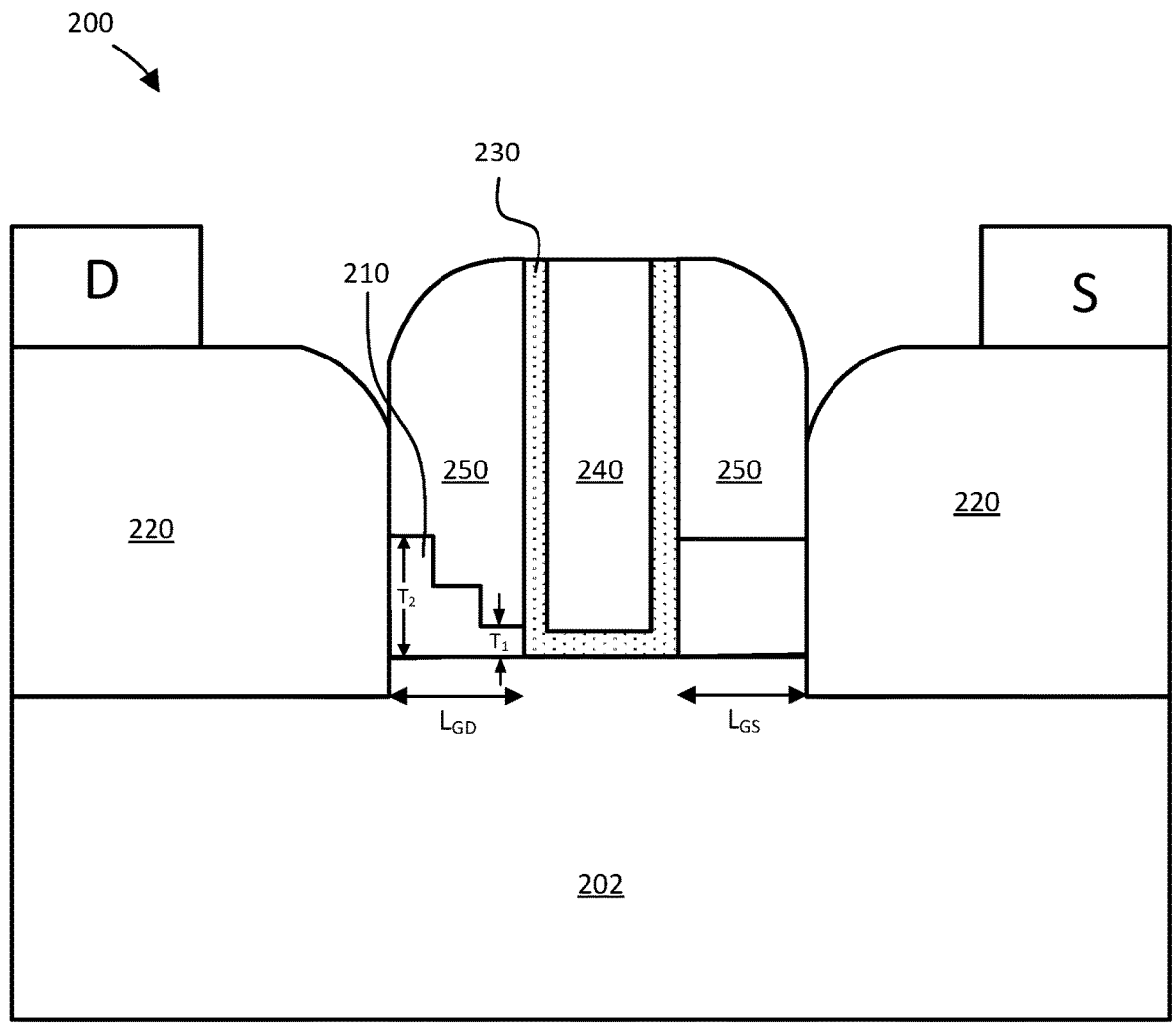
Figure 3C:
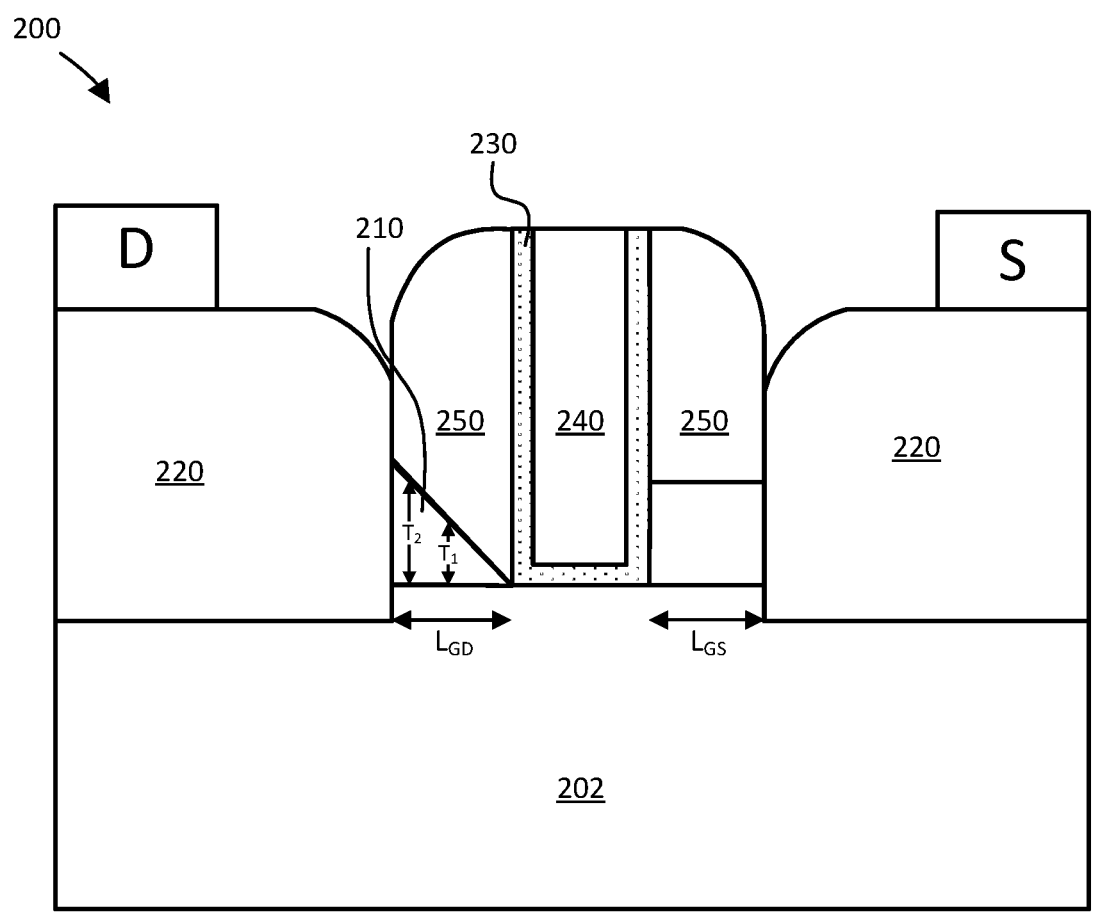

FIG. 1 illustrates a method 100 of forming an integrated circuit, in accordance with one or more embodiments of the present disclosure. FIGS. 2A-2F illustrate example integrated circuit structures that may be formed while carrying out method 100 of FIG. 1, in accordance with various embodiments of the present disclosure and FIGS. 3A-3C illustrate example integrated circuit structures, each having a geometrically manipulated polarization layer, in accordance with some embodiments of the present disclosure.

As can be seen in FIG. 1, method 100 includes forming 102 a gallium nitride (GaN) layer, in accordance with some example embodiments. In this example embodiment, the III GaN layer 202 is formed above an optional substrate 201. The GaN layer 202 may include the transistor channel. In some embodiments, substrate 201 may be a bulk substrate of one or more group IV materials/compounds, such as a bulk Si, Ge, SiC, or SiGe substrate, or substrate 201 may be a sapphire substrate, or substrate 201 may include any other suitable material, depending on the end use or target application. In some embodiments, substrate 201 may be an X on insulator (XOI) structure where X comprises Si, Ge, SiC, SiGe, or sapphire, and the insulator material is an oxide material or dielectric material or some other electrically insulating material. Although substrate 201 is illustrated in FIG. 2A as having a relatively small thickness relative to other layers, in some instances substrate 201 may be much thicker than the other layers, as will be appreciated. In some embodiments, particularly where GaN layer 202 is formed on a non-III-V material substrate (e.g., on a Si, Ge, SiGe, SiC, or sapphire substrate), an optional nucleation layer (not shown) may be formed between GaN layer 202 and substrate 201 to, for example, improve growth conditions and/or prevent the GaN layer 202 from reacting with the substrate material. In some such embodiments, nucleation layer may include a III-V semiconductor material, such as aluminum nitride (AlN), aluminum indium nitride (AlInN), aluminum gallium nitride (AlGaN), indium gallium nitride (InGaN), aluminum indium gallium nitride (AlInGaN), and/or a low temperature GaN (e.g., epitaxially grown at a temperature in the range of 500 to 950 degrees Celsius), for example. In some embodiments, optional nucleation layer may have a multilayer structure including multiple III-V materials, which may or may not include grading (e.g., increasing and/or decreasing content) of one or more materials throughout the multilayer structure. Further, in some such embodiments, nucleation layer may have any suitable thickness, so long as it can serve its intended purpose of interfacing the substrate 201 with the GaN layer 202. Note that the substrate 201 is not shown in in figures other than FIG. 2A, as it is optional. For a similar reason, optional nucleation layer between GaN layer 202 and substrate 201 is not shown. Other embodiments include, for example, GaN layer 202 formed on a III-V material substrate 201 such as gallium arsenide with or without a nucleation layer.

In some embodiments GaN layer 202 comprises at least 50%, at least 60%, at least 70%, at least 80%, at least 90%, at least 95%, or 100% GaN. GaN layer 202 may be doped or undoped and may, in some embodiments, include other compounds, including other III-N compounds. In some embodiments, GaN layer 202 may be, for example, approximately 1 micron in thickness (e.g., approximately 1 micron high when deposited) or less, or any other suitable thickness depending on the end use or target application. Method 100 of FIG. 1 continues with optionally depositing 104 one or more additional III-N layers such as, for example, aluminum nitride (AlN) or indium nitride (InN) or aluminum indium nitride (AlInN) or aluminum gallium nitride (AlGaN) or indium gallium nitride (InGaN) or aluminum indium gallium nitride (AlInGaN) or some other III-N compound on GaN layer 202. Any suitable deposition technique may be used to deposit the one or more additional III-N layers. In some embodiments, each additional III-N layer may have a thickness of less than 50 nm or any other suitable thickness depending on end use or target application. As will be appreciated, such an additional layer can be used as a lattice matching buffer layer between the GaN Layer 202 and a next layer (e.g., polarization layer) to facilitate transition from one III-N compound to the next. In these and other embodiments, an additional III-N layer may form at least a portion of the channel and/or may serve as a mobility enhancement layer (for example, in a polarization stack). In embodiments where the additional III-N layer material forms at least portion of the channel, the additional III-N layer may include materials such as indium gallium nitride. In embodiments where the additional III-N layer is used as a mobility enhancement material, the additional III-N layer may include aluminum nitride and/or other similar compounds. Note that any of the III-N layers may have at least one of its elements graded, in some embodiments. Alternatively, or in addition to, the additional layers may include spacer layers. In a more general sense, any number of III-N layers can be provided, depending on the device being built, ranging from just the GaN layer 202 to any number of additional III-N layers.

Method 100 of FIG. 1 continues with forming 106 a polarization layer as shown in the example structure shown in FIG. 2A, in accordance with some example embodiments. In some embodiments, polarization layer 210 may comprise, for example, aluminum nitride (AlN), aluminum gallium nitride (AlGaN), indium aluminum nitride (InAlN), indium aluminum gallium nitride (InAlGaN), any mixture thereof, or any other suitable III-N compound, as will be apparent in light of this disclosure. Polarization layer 210 as well as other layers provided herein may be formed by any suitable deposition process, including but not limited to chemical vapor deposition (CVD), atomic layer deposition (ALD) and/or physical vapor deposition (PVD). In some example embodiments, polarization layer may be epitaxially grown, such as by liquid phase epitaxy (LPE), metal-organic chemical vapor deposition (MOCVD), or molecular beam epitaxy (MBE). In a more general sense, any forming methods can be used to provide the structure shown in FIG. 2A, as will be appreciated in light of this disclosure.

In some embodiments, a region of polarization layer 210 may be etched to provide a gate region. In some such embodiments, a dummy gate 242 may be formed in the etched region of the polarization layer 210, as shown in FIG. 2A, in accordance with some example embodiments. Dummy gate 242 may be formed, for example, by dummy gate oxide deposition, dummy gate electrode (e.g., poly-Si) deposition, and/or patterning hardmask deposition. Additional optional processing may include patterning the dummy gate, as desired. In other embodiments, the actual gate can be provided. In a more general sense, any suitable gate forming processes can be used to form gate 242.

Method 100 continues with depositing 110 one or more spacer materials 250. In some embodiments, two or more types of spacer materials may be applied to the polarization layer 210. FIG. 2A shows an embodiment that employs three types of spacer materials (250a, 250b and 250c). As can be seen in the example embodiment shown in FIG. 2A, a first type of spacer material 250a is positioned closest to the gate region, a second type of spacer material 250b is positioned farther from the gate region than the first type of spacer material and a third type of spacer material 250c is positioned farther from the gate region than the second type of spacer material. Additional types of spacer materials may also be deposited in addition to those shown in FIG. 2A. For example, in some embodiments 4, 5, 6, 7, 8, 9, or 10 or more types of spacer materials may be utilized in accordance with some embodiments of the subject disclosure.

Various techniques can be used to form the example columnar spacer arrangement shown in FIG. 2A. For example, in some embodiments, first spacer material 250a may be conformally deposited onto polarization layer 210 and dummy gate 242 (e.g., such that the exposed horizontal and vertical faces of the dummy gate and polarization layer are each coated with first spacer material 250a). After deposition, the first spacer material 250a may be etched to remove all or essentially all of the first spacer material 250a on the horizontal surfaces of dummy gate 242 and polarization layer 210, while leaving the first spacer material 250a present on the vertical surface of dummy gate 242 intact. In some embodiments, anisotropic dry etch processes may be used to accomplish the directional etch of the first spacer material 250a. Formation of additional spacer materials may be accomplished by repeating these deposition and etching techniques until a desired spacer structure is achieved. In some select embodiments, masking and lithography techniques may also be employed to provide a series of spacers. Any number of spacer layers may be provided, including 2, 3, 4, 5, and so on up to hundreds of layers or more, depending on the desired granularity of the staircase or ramp (number of steps making up the upper surface of the geometrically manipulated polarization layer), as will be appreciated in light of this disclosure.

Method 100 continues with etching 112 at least a portion of the spacer material and etching 114 at least a portion of the polarization layer 210. In some embodiments, etchants may be selected based on the types of spacer and polarization materials present. For example, in embodiments where more than one type of spacer material is used, an etchant used to etch a first type of spacer material may be selective to the targeted spacer material in that it either (1) removes the targeted spacer material without etching away the other types of spacer materials present or (2) etches away the targeted type of spacer materials at a faster rate than it etches away other spacer materials present. In some embodiments, an etchant used to etch a particular type of spacer material may also etch or partially etch an underlying region of the polarization layer 210, while in other embodiments, a separate etchant may be used to etch an underlying region of the polarization layer 210, as desired. Masking can also be used to isolate targeted material to be etched, according to other embodiments. Any suitable etching technique may be used to etch the spacer materials and/or underlying portions of the polarization layer 210, as will be appreciated in light of this disclosure. For example, in accordance with some embodiments, wet and dry etch techniques, including chlorine or fluorine-based chemistry, may be used.

FIGS. 2A-2F illustrate a series of example structures that may be formed while etching at least a portion of the spacer material and a portion of the polarization layer 210, in accordance with some example embodiments. As shown in FIGS. 2A-2F, the first type of spacer material 250a shown in FIG. 2A may be etched to form a structure shown in FIG. 2B, in accordance with an example embodiment. After the first spacer material 250a is etched, a portion of the underlying polarization layer 210 may also be etched to form the resulting structure shown in FIG. 2C, in accordance with an example embodiment. In this example embodiment, the second type of spacer material 250b may be etched to form the resulting structure shown in FIG. 2D. An underlying region of the polarization layer 210 may also be etched to form the resulting structure shown in FIG. 2E, in accordance with an example embodiment. Thereafter, the third type of spacer material 250c may then be etched to form the resulting structure shown in FIG. 2F, in accordance with an example embodiment. As will be appreciated, in some embodiment, regions of polarization layer 210 that are exposed to more than one etchant may become progressively more etched upon exposure to each etchant. For example, in some embodiments, the portion of the polarization layer 210 underlying the first spacer material 250a may be etched upon exposure to the etchants used to etch the second type of spacer material 250b, the region of the polarization layer 210 underlying spacer material 250b, and/or the third type of spacer material 250c.

As will be further appreciated, the cross-sectional profile that reveals thinner regions of the polarization layer 210 proximate to the gate, such as a staircase profile shown in FIG. 2F where the stairs descend toward the gate, can have many shapes and features. To this end, the profile shown in FIG. 2F may look different in other embodiments. For instance, FIGS. 2F', 2F", and 2F''' each show an example structure that may result using a spacer-based forming process as provided herein. Note that the rise and run of the stair case need not reflect a perfectly orthogonal relationship and that the rise (y-direction) may not necessarily be perpendicular to the run (x-direction). Further note that the rise and run of the stair case need not be symmetrical or otherwise consistent. For instance, FIG. 2F' shows an example resulting stair case having a rise/run configuration where the run portion slants downward toward the dummy gate 242. In addition, the rise to the top step is longer than the rise to the second step. FIG. 3F", on the other hand, shows an example resulting stair case having a rise/run configuration where the run portion slants upward toward the dummy gate 242. FIG. 3F''' shows an example resulting stair case where the first stair (closest to the dummy gate 242) is relatively short compared to the other two steps. This could be, for instance, due to the case where the first step is exposed to a greater amount of etching than the other steps. Numerous such variations will be apparent in light of this disclosure.

Any number of suitable spacer materials may be used to accomplish the techniques disclosed herein. For example, in some embodiments, $SiO_2$, $Si_3N_4$, various silicon oxy-nitrides, and ALD-based materials, such as $Al_2O_3$ and $Ta_2O_5$, and combinations thereof may be used as spacer materials. For purposes of illustration only one particular spacer arrangement and etch scheme is described in detail here; however, numerous other configurations will be apparent in light of this disclosure. In one particular example embodiment in which three types of spacer materials are used, $Al_2O_3$ may be used as a first spacer material (positioned closest to the gate), $SiO_2$ may be used as the second type of spacer material, and $Si_3N_4$ may be used as the third type of spacer material (positioned farthest from the gate). A diluted hydrofluoric acid solution (e.g., 50 parts water to 1 part HF) may be used to etch the first two types of spacer materials, in some embodiments selectively etching the first type of spacer material at a faster rate than the second type of spacer material. An anisotropic or directional dry etch technique may then be used to remove a targeted amount of the polarization layer beneath the region where the first spacer material had formerly resided. A more concentrated hydrofluoric acid solution (e.g., less than 50 parts water to 1 part HF) may be used to remove any remaining portion of the second type of spacer material. An appropriate directional dry etch technique may then be used to remove a targeted amount of the polarization layer beneath the region where the second spacer material had formerly resided. A more concentrated hydrofluoric acid solution (e.g., approximately 49% HF) may then be used to remove the third type of spacer material and a suitable directional dry etch technique may be used to remove a region of the polarization layer formerly underlying the third type of spacer material, if desired. As will be appreciated, spacer materials can be selected to facilitate etch selectivity with respect to a given etchant scheme to bring about desired stepped or otherwise sloped profiles within the targeted polarization layer. Numerous variations of this example method will be apparent in light of this disclosure.

As will be appreciated, the example method shown in FIGS. 2C-2F uses three types of spacer materials to form a geometrically manipulated polarization layer 210 shown in FIGS. 2F and 3B, having a "staircase" shape, in accordance with one particular embodiment. As will be appreciated in light of this disclosure, a different number of layers can be used to provide a different number of steps in the staircase. For example, two types of spacer materials may be used to form the example geometrically manipulated polarization layer 210 shown in FIGS. 2C and 3A, having a single step or "notched" shape. As will also be apparent in light of this disclosure, a relatively larger number of spacer materials (e.g., more than 4, more than 5, more than 6, more than 7, more than 8, more than 9, or more than 10) may be used to form the example geometrically manipulated polarization layer 210 shown in FIG. 3C, having a "slanted" shape. The greater the number of distinct spacer layers 250, the finer the step resolution and smoothness of the ramp. After geometrically manipulated polarization layer 210 has been formed, any residual spacer materials 250 may be removed and/or new spacer material(s) 250 may be deposited, as desired.

Method 100 continues with completing 116 formation of the transistor(s) to form the resulting integrated circuit structures 200 as shown in FIGS. 3A-3C, in accordance with some example embodiments. Following formation of the geometrically manipulated polarization layer 210, the source/drain regions 220 may be formed, for example by deposition of n-type InGaN in those regions, or some other suitable source/drain material having a desired III-N composition and polarity (e.g., GaN, AlN, InN, and any compounds thereof, whether n-type or p-type). Additionally, the dummy gate 242, if present, may be replaced with a gate dielectric 230 and a replacement metal gate 240, for example. Other embodiments may include a standard gate stack formed by any suitable process, such as a subtractive process where the gate dielectric/gate metal is deposited and then followed by one or more etching processes. Any number of standard device-forming processes (e.g., CVD, PVD, ALD, MBE, MOCVD to name a few) may also be performed to help complete 116 the formation of the one or more transistors. The gate dielectric 230 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 230 to improve its quality when a high-k material is used. In general, the thickness of the gate dielectric 230 should be sufficient to electrically isolate the gate electrode 240 from the source and drain contacts, generally designated as D and S in FIGS. 3A-C. Further, the gate electrode 240 may comprise, for example, aluminum, tungsten, titanium, or other suitable gate metals and alloys thereof. The source and drain contact material may be, for example, titanium, aluminum, tungsten, silver, nickel, or other suitable contact metals and alloys thereof. In some embodiments, note that the gate dielectric and/or gate electrode may be formed of multi-layer structures. For instance, the gate dielectric may include a stack of two or more dielectric layers (e.g., high-k dielectric materials) or a continuous layer or material having at least one graded component. Likewise, the gate electrode may include one or more work-function tuning layers, resistance-reducing layers, or capping layers, in addition to the electrode plug. In a more general sense, each of the electrode 240 and gate dielectric 230 may include one or more intervening layers between or on them. For example, one or more intervening layers may be present between the gate dielectric 230 and gate electrode 240 materials to improve interface quality and/or electric properties between the gate dielectric and gate electrode materials.

Although FIGS. 3A-3C shows specific example structures for a geometrically manipulated polarization layer 210, geometrically manipulated polarization layer 210 may be formed in accordance with any desired structure, and may be otherwise manipulated to form other geometries, in accordance with various embodiments. In some embodiments, the geometric manipulation of the polarization layer 210 occurs symmetrically in both the source and drain regions 220, whereas in other embodiments, the geometric manipulation of the polarization layer 210 occurs asymmetrically in only one of the source and drain regions 220. For example, as shown in the example embodiments of FIGS. 3A-3C, the polarization layer 210 of integrated circuit 200 is geometrically manipulated in only the drain region.

Figure 4A:
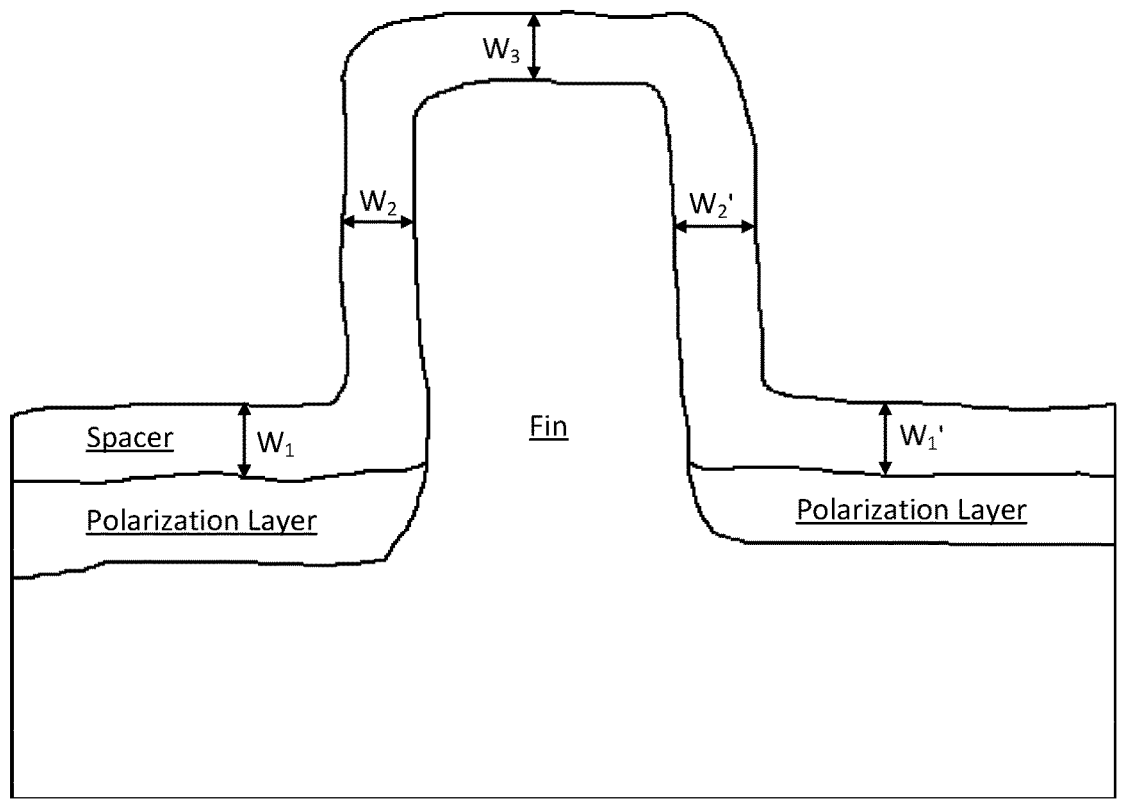
FIG. 4A and FIG. 4B illustrate example structures that may be formed through an example asymmetrical etch process, in accordance with some example embodiments.
Figure 4B:
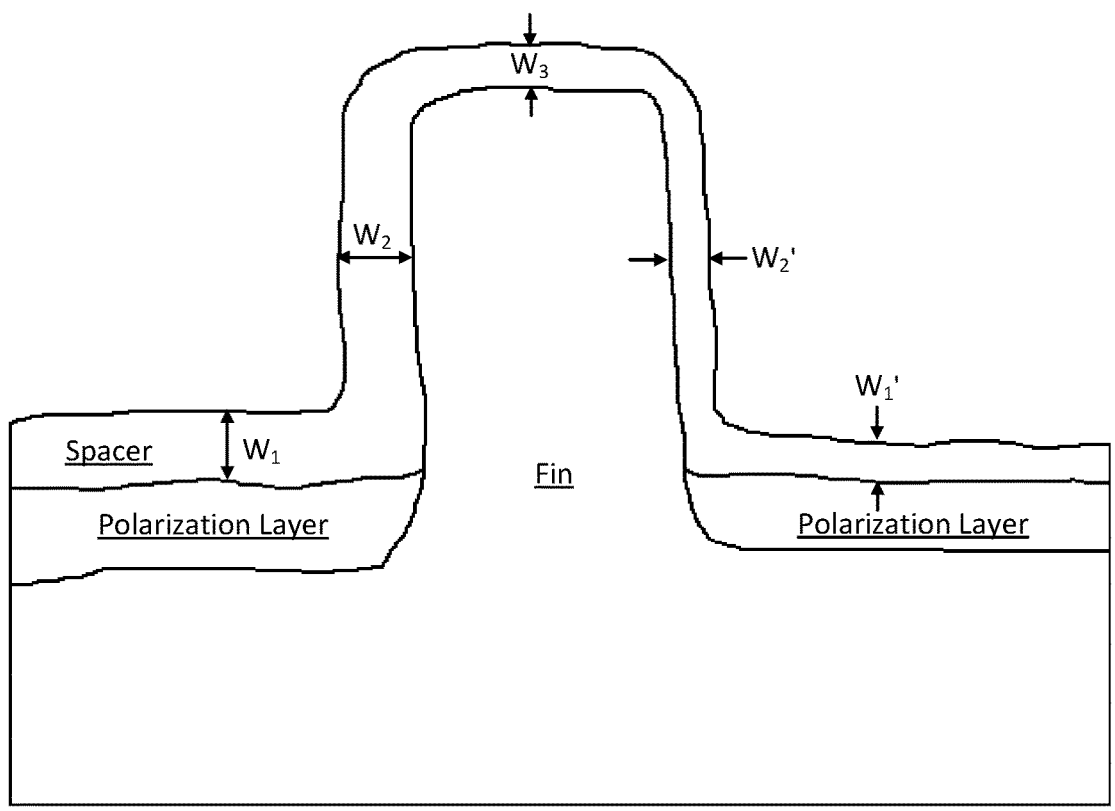

FIGS. 4A and 4B show example structures that may be formed through an example asymmetrical etch process, in accordance with some example embodiments. Specifically, FIG. 4A shows a substrate having a fin which in this case is being used as a dummy gate stack. The substrate and fin may be formed of silicon or any type of dummy gate materials.

As can be seen, polarization layers may be formed on the substrate and may extend to the sides of the fin. As will be further appreciated, there may further be an underlying channel layer of GaN (not shown here, but in other figures), between the substrate and the polarization layer. Polarization layers may be formed of any suitable materials discussed with respect to polarization layer 210 or may be any type of silicon oxide-based material. Spacer material may also be deposited over the polarization layers and the exposed portions of the fin. The spacer materials may be any materials discussed herein with respect to spacers 250, such as silicon nitride. The width of the spacer materials at various points is shown in FIG. 4A as $W_1$-$W_3$. In particular, $W_1$ is the width of the spacer material on the polarization layer on one side of the fin; $W_1'$ is the width of the spacer material on the polarization layer on the opposite side of the fin; $W_2$ is the width of the spacer material on one side of the fin; $W_2'$ is the width of the spacer material on the opposite side of the fin; and $W_3$ is the width of the spacer material on the top of the fin. In some embodiments, the spacer material may be deposited conformally over the polarization layers and fin. In these and other embodiments, $W_1$ may be approximately equal to $W_1'$ and/or $W_2$ may be approximately equal to $W_2'$. As will be further appreciated, in some embodiments, $W_3$ may be approximately equal to $W_1$ and/or $W_2$. In some example embodiments, $W_1$ and $W_1'$ may be each between 25 and 50 nm, $W_2$ and $W_2'$ may be between 20 and 40 nm, and $W_3$ may be between 30 and 60 nm.

FIG. 4B shows an example resulting structure after the structure shown in FIG. 4A has been subjected to an asymmetric etch process, according to some example embodiments. Any suitable asymmetric etch process may be used. For example, masking materials may be deposited in a region on one side of the fin and may remain in place until the desired etch on one side of the fin is achieved. After etching has occurred on one side of the fin, the masking materials may then be removed. As can be seen in FIG. 4B, after an asymmetric etching has occurred, the width of the spacer materials on opposite sides of the fin may be different. For example, in some embodiments the spacer material may be etched such that $W_1'$ is less than $W_1$ and/or $W_2'$ is less than $W_2$. In one particular example embodiment, after an asymmetric etch process, $W_1$ and $W_2$ may each have a width that is between 20 and 35 nm, while $W_1'$ may have a width that is between 5 and 25 nm and $W_2'$ may have a width that is between 10 and 30 nm.

As can be seen in each of the embodiments shown in FIGS. 3A-C, the geometrically manipulated polarization layer 210 has a non-uniform thickness that varies across its length. In particular, the geometrically manipulated polarization layer 210 is thinner in a region closer to the gate 240 and thicker in a region farther from the gate 240. In accordance with some embodiments, the polarization layer may have a thickness in the range of 0-5 nm at a first point ($T_1$) and a thickness in the range of 10-20 nm at a second point ($T_2$). In some embodiments, the thickness of the polarization layer 210 at a first point is at least 50%, at least 75%, at least 100%, at least 125% or at least 150% less than its thickness at a second point. In some of these embodiments, the first point ($T_1$) is closer to the gate 240 than the second point ($T_2$). In still further embodiments, the narrowest point of the polarization layer 210 is closer to the gate 240 than any other point of the polarization layer 210. As will be appreciated, the reference to thickness of the polarization layer 210 refers to the vertical thickness of the polarization layer 210 between the underlying GaN Layer 202 and the above spacer material 250 at a given point, as seen in the cross-sectional views of FIGS. 3A-C. As will be further appreciated, $T_1$ is a closer distance to the gate 240 than is $T_2$.

The disclosed geometrically manipulated polarization layers may improve breakdown without impacting Ron resistance. Any of the disclosed polarization layer shapes (e.g., notched, staircase, slanted, elliptical, curved, or other shape having a profile that reveals narrower thickness near the gate area) may be useful in achieving the desired performance characteristics and any appropriate shape may be selected based, at least in part, by considering process complexity and gain. Additionally, the disclosed integrated circuits that include geometrically manipulated polarization layers can achieve comparable or better performance capabilities as ICs with polarization layers of uniform thickness that employ a field plate. A geometrically manipulated polarization layer according to some embodiments provides benefits if located on the drain side, particularly in cases where transistor breakdown tends to occur between the gate and drain. However, a geometrically manipulated polarization layer as provided herein may be present on both the drain side and the source side, or just the source side in some embodiments, depending factors such as breakdown probabilities, as will be further appreciated in light of this disclosure.

The disclosed geometrically manipulated polarization layers may have a shorter horizontal length (between the gate and source/drain region) than polarization layers of uniform thickness, while maintaining the same performance characteristics. A typical polarization layer has a length of at least 80 nm. FIGS. 3A-3C show the length of the polarization layer on the drain side ($L_{GD}$) and the length of the polarization layer on the source side ($L_{GS}$). In some example embodiments, $L_{GD}$ is approximately equal to $L_{GS}$, while in other example embodiments, $L_{GD}$ is not equal to $L_{GS}$. In some such embodiments, $L_{GD}$ is less than $L_{GS}$, while in other embodiments, $L_{GD}$ is greater than $L_{GS}$. In particular example embodiments, the polarization layers according to the subject disclosure may have an $L_{GD}$ that is less than 80 nm, less than 70 nm, less than 60 nm, less than 50 nm, less than 40 nm, or less than 30 nm. In some such embodiments, $L_{GS}$ may track $L_{GD}$, but need not in other embodiments. In still other embodiments, $L_{GS}$ and $L_{GD}$ may be switched, wherein $L_{GS}$ is less than 80 nm, less than 70 nm, less than 60 nm, less than 50 nm, less than 40 nm, or less than 30 nm. In such cases, $L_{GD}$ may track $L_{GS}$ in some such embodiments, but need not in other embodiments. Note that the spacer above the polarization layer may track the underlying polarization layer and therefore also be smaller in length. Further note, however, that such smaller horizontal lengths are not required or otherwise intended to limit the present disclosure. Numerous variations and configurations will be apparent in light of this disclosure.

Various methods can be used to determine whether a device has been produced using the disclosed techniques. For example, methods of structure analysis (e.g., scanning/transmission electron microscopy (SEM/TEM), composition mapping, and/or atom probe imaging/3D tomography) can be used to determine the cross-sectional profile shape and dimensions of polarization layers of a given integrated circuit.

Example System

Figure 5:
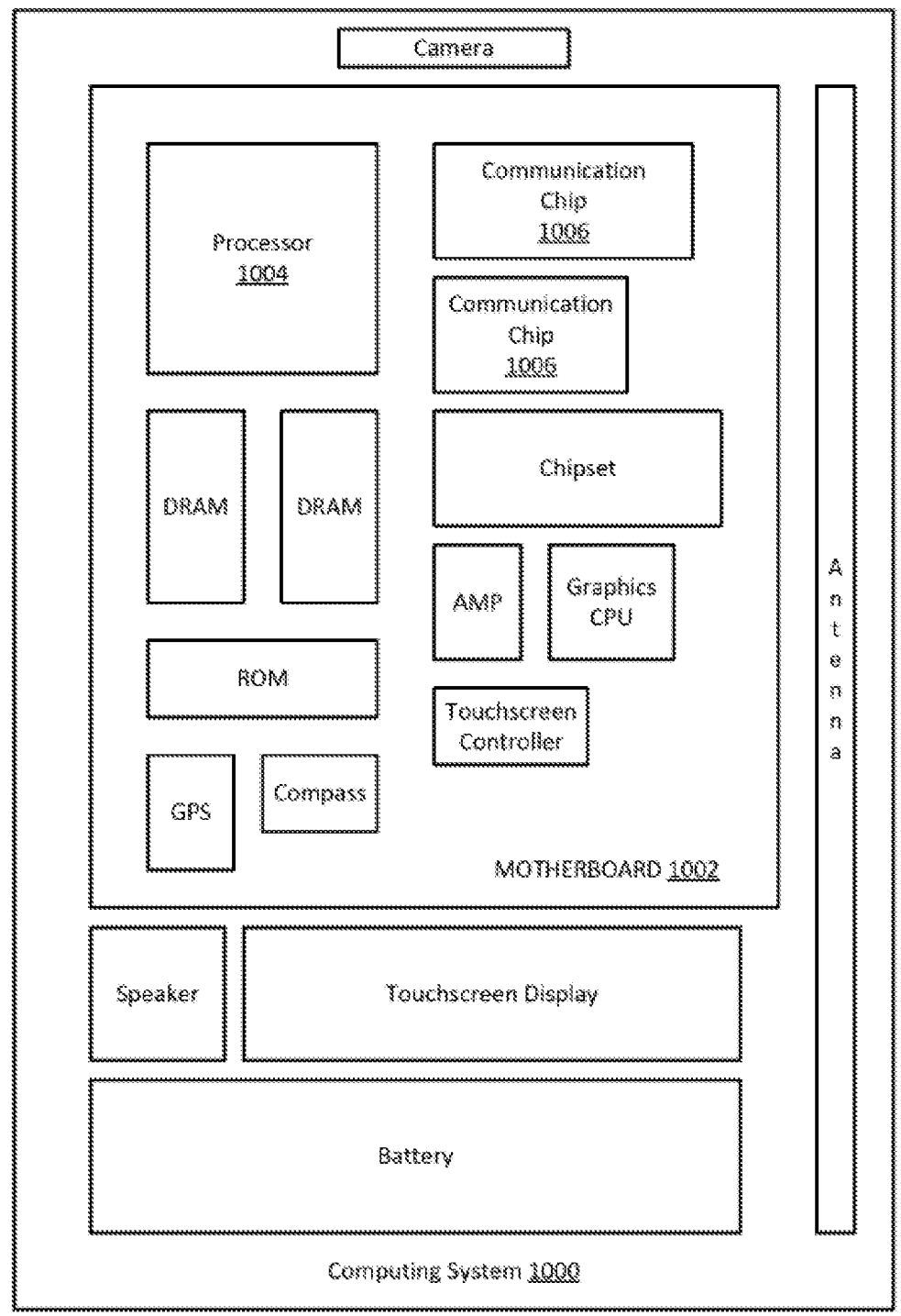
FIG. 5 illustrates an example computing system implemented with one or more integrated circuits comprising one or more geometrically manipulated polarization layers, configured in accordance with example embodiments of the present disclosure.

FIG. 5 illustrates a computing system 1000 implemented with one or more integrated circuit structures configured and/or otherwise fabricated in accordance with an example embodiment of the present disclosure. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of computing system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured to include one or geometrically manipulated polarization layers, as variously described herein. These integrated circuit structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor includes onboard memory circuitry that is implemented with one or more integrated circuit structures configured with geometrically manipulated polarization layers, as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more integrated circuit structures formed as variously described herein (e.g., semiconductor structures that include one or more geometrically manipulated polarization layers). As will be appreciated in light of this disclosure, note that multi-standard wireless capability may be integrated directly into the processor 1004 (e.g., where functionality of any communication chips 1006 is integrated into processor 1004, rather than having separate communication chips). Further note that processor 1004 may be a chip set having such wireless capability. In short, any number of processors 1004 and/or communication chips 1006 can be used. Likewise, any one chip or chip set can have multiple functions integrated therein. In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing system 1000 may be any other electronic device that processes data or employs integrated circuit features configured with one or more geometrically manipulated polarization layers, as variously described herein. Numerous embodiments will be apparent, and features described herein can be combined in any number of configurations.

Further Example Embodiments

The following examples pertain to further embodiments, from which numerous permutations and configurations will be apparent.

Example 1 is an integrated circuit transistor device that includes: a channel layer that includes gallium nitride (GaN); a gate over the channel layer; and a polarization layer over the channel layer and adjacent one side of the gate, wherein the polarization layer has a vertical thickness at a first distance from the gate and a vertical thickness at a second distance from the gate, and the vertical thickness at the first distance from the gate is at least 50% less than the vertical thickness at the second distance from the gate.

Example 2 includes the subject matter of Example 1, wherein the vertical thickness at the first distance from the gate is at least 100% less than the vertical thickness at the second distance from the gate.

Example 3 includes the subject matter of any of Examples 1-2, wherein the vertical thickness at the first distance from the gate is at least 150% less than the vertical thickness at the second distance from the gate.

Example 4 includes the subject matter of any of Examples 1-3, wherein the first distance from the gate is less than the second distance from the gate.

Example 5 includes the subject matter of Example 4 and further includes an additional polarization layer over the channel layer and adjacent another side of the gate, the additional polarization layer having a substantially uniform vertical thickness.

Example 6 includes the subject matter of Example 4 and further includes an additional polarization layer over the channel layer and adjacent another side of the gate, one polarization layer positioned between the gate and a drain of the transistor device, and the other polarization layer positioned between the gate and a source of the transistor device.

Example 7 includes the subject matter of any of Examples 1-6, wherein the polarization layer is positioned between the gate and a drain.

Example 8 includes the subject matter of any of Examples 1-7, wherein the polarization layer has a length of less than 50 nm.

Example 9 includes the subject matter of any of Examples 1-8, wherein the polarization layer has a length of less than 40 nm.

Example 10 includes the subject matter of any of Examples 1-9, wherein the polarization layer has a length of less than 30 nm.

Example 11 includes the subject matter of any of Examples 1-10, wherein the polarization layer has a notched shape.

Example 12 includes the subject matter of any of Examples 1-11, wherein the polarization layer has a staircase shape.

Example 13 includes the subject matter of any of Examples 1-12, wherein the polarization layer has a slanted shape.

Example 14 includes the subject matter of any of Examples 1-13, wherein the integrated circuit transistor device is field plate free.

Example 15 includes the subject matter of any of Examples 1-14, and further includes at least one additional III-N layer positioned between the channel layer that includes GaN.

Example 16 includes the subject matter of Example 15, wherein the additional III-N layer includes indium gallium nitride.

Example 17 is an integrated circuit transistor device that includes: a substrate; a first region that includes gallium nitride (GaN) over at least a portion of the substrate; a gate over the first region; and a second region that includes a III-N compound over at least a portion of the first region and adjacent one side of the gate, wherein the second region has a vertical thickness at a first distance from the gate that is at least 5 nm less than a vertical thickness at a second distance from the gate.

Example 18 includes the subject matter of Example 17, wherein the vertical thickness at the first distance from the gate is at least 10 nm less than the vertical thickness at the second distance from the gate.

Example 19 includes the subject matter of any of Examples 17-18, wherein the vertical thickness at the first distance from the gate is at least 15 nm less than the vertical thickness at the second distance from the gate.

Example 20 includes the subject matter of any of Examples 17-19, wherein the first distance from the gate is less than the second distance from the gate.

Example 21 includes the subject matter of any of Examples 17-20, wherein at least a portion of the second region separates the gate from a drain.

Example 22 includes the subject matter of any of Examples 17-21, wherein the second region has a length of less than 50 nm.

Example 23 includes the subject matter of any of Examples 17-22, wherein the second region has a length of less than 40 nm.

Example 24 includes the subject matter of any of Examples 17-23, wherein the second region has a length of less than 30 nm.

Example 25 includes the subject matter of any of Examples 17-24, wherein the second region has a notched shape.

Example 26 includes the subject matter of any of Examples 17-5 wherein the second region has a staircase shape.

Example 27 includes the subject matter of any of Examples 17-26, wherein the second region has a slanted shape.

Example 28 includes the subject matter of any of Examples 17-27, wherein the integrated circuit transistor device is field plate free.

Example 29 includes the subject matter of any of Examples 17-28 and further includes a third region that includes a III-N compound over at least a portion of the first region and adjacent another side of the gate, wherein the third region has a substantially uniform vertical thickness.

Example 30 includes the subject matter of any of Examples 17-28 and further includes a third region that includes a III-N compound over at least a portion of the first region and adjacent another side of the gate, wherein the third region has a vertical thickness at a first distance from the gate that is at least 5 nm less than a vertical thickness at a second distance from the gate.

Example 31 is a method of producing a geometrically manipulated polarization layer, the method including: forming a layer that includes gallium nitride (GaN); forming at least one polarization layer over the layer that includes GaN; depositing a first spacer material on a first region of the polarization layer; depositing a second spacer material on a second region of the polarization layer; and selectively etching the first spacer material and at least a portion of the first region of the polarization layer to form a geometrically manipulated polarization layer.

Example 32 includes the subject matter of claim 31 and further includes etching the second spacer material.

Example 33 includes the subject matter of any of Examples 31-32 and further includes depositing a third spacer material on a third region of the polarization layer.

Example 34 includes the subject matter of any of Examples 31-33 and further includes etching at least a portion of the second region of the polarization layer.

Example 35 includes the subject matter of Example 34 and further includes etching the third spacer material.

Example 36 includes the subject matter of any of Examples 31-35, wherein the geometrically manipulated polarization layer has at least one of a notched shape, a staircase shape, or a slanted shape.

Example 37 includes the subject matter of any of Examples 31-36 and further includes forming a gate, a drain and a source over the layer that includes GaN.

Example 38 includes the subject matter of Example 37, wherein the geometrically manipulated polarization layer separates the gate from the drain.

Example 39 includes the subject matter of any of Examples 31-38 and further includes depositing at least one additional layer that includes a III-N material between the layer that includes GaN and the polarization layer.

Example 40 includes the subject matter of Example 39, wherein the additional layer that includes a III-N material includes indium gallium nitride.

Example 41 includes the subject matter of any of Examples 31-40, wherein the geometrically manipulated polarization layer has a vertical thickness at a first distance from a gate and a vertical thickness at a second distance from the gate and the vertical thickness at the first distance from the gate is at least 50% less than the vertical thickness at the second distance from the gate.

Example 42 includes the subject matter of any of Examples 31-41, wherein the geometrically manipulated polarization layer has a vertical thickness at a first distance from a gate and a vertical thickness at a second distance from the gate and the vertical thickness at the first distance from the gate is at least 5 nm less than the vertical thickness at the second distance from the gate.

Example 43 includes the subject matter of any of Examples 31-42, wherein the geometrically manipulated polarization layer has a length of less than 50 nm.

Example 44 is an apparatus configured to perform the subject matter of any of Examples 31-43.

Example 45 is an integrated circuit transistor device produced by the subject matter of any of Examples 31-43.

The foregoing description of example embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

What is claimed is:

1. An integrated circuit device, comprising:
a first layer comprising gallium and nitrogen;
a gate over the first layer;
a first source or drain region over the first layer, wherein a bottom surface of the first source or drain region is lower than a top surface of the first layer;
a second source or drain region over the first layer, wherein a bottom surface of the second source or drain region is lower than the top surface of the first layer; and
a second layer over the top surface of the first layer and adjacent one side of the gate such that the second layer is between the gate and the first source or drain region, the second layer comprising a III-N compound, wherein the second layer has a thinnest vertical thickness at a point closest to the gate and a thickest vertical thickness at a point farthest from the gate.

2. The device of claim 1, wherein the thinnest vertical thickness at the point closest to the gate is at least 75% less than the thickest vertical thickness at the point farthest from the gate.

3. The device of claim 1, wherein the integrated circuit device is field plate free.

4. The device of claim 1, further comprising:
a first gate spacer at least partially between the gate and the first source or drain region, the first gate spacer being at least above and on the thinnest vertical thickness of the second layer and the thickest vertical thickness of the second layer; and
a second gate spacer at least partially between the gate and the second source or drain region.

5. The device of claim 4, wherein a width of the first gate spacer is different than a width of the second gate spacer.

6. The device of claim 1, further comprising:
an additional second layer over the first layer and adjacent another side of the gate such that the additional second layer is between the gate and the second source or drain region, the additional second layer comprising the III-N compound.

7. An integrated circuit device, comprising:
a first region comprising gallium nitride (GaN);
a gate over the first region;
a first source or drain region over the first region, wherein a bottom surface of the first source or drain region is lower than a top surface of the first region;
a second source or drain region over the first region, wherein a bottom surface of the second source or drain region is lower than the top surface of the first region; and
a second region comprising a III-N compound over at least a portion of the first region and adjacent one side of the gate such that the second region is between the gate and the first source or drain region, wherein the second region has a first vertical thickness at a point closest to the gate that is at least 5 nm less than a second vertical thickness at a point farthest from the gate.

8. The device of claim 7, wherein the first vertical thickness at the point closest to the gate is at least 10 nm less than the second vertical thickness at the point farthest from the gate.

9. The device of claim 7, wherein the integrated circuit device is field plate free.

10. The device of claim 7, further comprising:
a first gate spacer at least partially between the gate and the first source or drain region, the first gate spacer being at least above and on the first vertical thickness of the second region and the second vertical thickness of the second region; and
a second gate spacer at least partially between the gate and the second source or drain region.

11. The device of claim 10, wherein a width of the first gate spacer is different than a width of the second gate spacer.

12. The device of claim 7, further comprising:
a third region comprising the III-N compound over at least a portion of the first region and adjacent another side of the gate such that the third region is between the gate and the second source or drain region.

13. An integrated circuit device, comprising:
a first layer comprising gallium and nitrogen;
a first source or drain region over the first layer, wherein a bottom surface of the first source or drain region is lower than a top surface of the first layer;
a second source or drain region over the first layer, wherein a bottom surface of the second source or drain region is lower than the top surface of the first layer;
a gate structure over the first layer, the gate structure at least partially between the first source or drain region and the second source or drain region, the gate structure including a gate dielectric and a gate electrode;
a second layer over the top surface of the first layer and at least partially between the gate structure and the first source or drain region, the second layer comprising a III-N compound, wherein the second layer has a thinnest vertical thickness at a point closest to the gate structure and a thickest vertical thickness at a point farthest from the gate structure towards the first source or drain region, the thinnest vertical thickness being at least 50% less than the thickest vertical thickness.

14. The device of claim 13, wherein the thinnest vertical thickness is at least 75% less than the thickest vertical thickness.

15. The device of claim 13, further comprising:
a first gate spacer at least partially between the gate structure and the first source or drain region, the first gate spacer being at least above and on the thinnest and thickest vertical thicknesses of the second layer; and
a second gate spacer at least partially between the gate structure and the second source or drain region.

16. The device of claim 15, wherein a first portion of the gate dielectric is between the first gate spacer and the gate electrode, and a second portion of the gate dielectric is between the second gate spacer and the gate electrode.

17. The device of claim 15, wherein a width of the first gate spacer is different than a width of the second gate spacer.

18. The device of claim 13, wherein the integrated circuit device is field plate free.

19. The device of claim 13, wherein the thinnest vertical thickness is at least 10 nm less than the thickest vertical thickness.

20. The device of claim 13, further comprising:
an additional second layer over the first layer and at least partially between the gate structure and the second source or drain region, the additional second layer comprising the III-N compound.

* * * * *